(12) United States Patent
Huang et al.

(10) Patent No.: US 11,177,212 B2
(45) Date of Patent: Nov. 16, 2021

(54) CONTACT FORMATION METHOD AND RELATED STRUCTURE

(71) Applicant: Taiwan Semiconductor Manufacturing Co., Ltd., Hsinchu (TW)

(72) Inventors: Po-Yu Huang, Hsinchu (TW); Shih-Che Lin, Hsinchu (TW); Chao-Hsun Wang, Chung-Li (TW); Kuo-Yi Chao, Hsinchu (TW); Mei-Yun Wang, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/846,910

(22) Filed: Apr. 13, 2020

(65) Prior Publication Data

US 2021/0320061 A1  Oct. 14, 2021

(51) Int. Cl.
*H01L 21/768* (2006.01)
*H01L 23/522* (2006.01)
(Continued)

(52) U.S. Cl.
CPC .... *H01L 23/5226* (2013.01); *H01L 21/76804* (2013.01); *H01L 21/76816* (2013.01); *H01L 21/76831* (2013.01); *H01L 21/76832* (2013.01); *H01L 21/76844* (2013.01); *H01L 21/76877* (2013.01); *H01L 21/76895* (2013.01); *H01L 21/823431* (2013.01); *H01L 21/823475* (2013.01); *H01L 23/5283* (2013.01);
(Continued)

(58) Field of Classification Search
CPC ......... H01L 21/76802; H01L 21/76804; H01L 21/76814; H01L 21/76816; H01L 21/76831; H01L 21/76832; H01L 21/76834; H01L 21/7684; H01L 21/76844; H01L 21/76877; H01L 21/76883; H01L 21/76895; H01L 21/823475; H01L 23/5226; H01L 23/5283; H01L 23/53295
See application file for complete search history.

(56) References Cited

U.S. PATENT DOCUMENTS 7,037,798 B2 * 5/2006 Adam ................. H01L 29/1004
                                                      257/E21.371
8,772,109 B2   7/2014 Colinge
(Continued)

*Primary Examiner* — Stephen W Smoot
(74) *Attorney, Agent, or Firm* — Haynes and Boone, LLP

(57) ABSTRACT

A method and structure for forming semiconductor device includes forming a contact via opening in a first dielectric layer, where the contact via opening exposes a first portion of a contact etch stop layer (CESL). The method further includes etching both the first portion of the CESL exposed by the contact via opening and adjacent lateral portions of the CESL to expose a source/drain contact and form an enlarged contact via opening having cavities disposed on either side of a bottom portion of the enlarged contact via opening. The method further includes forming a passivation layer on sidewall surfaces of the enlarged contact via opening including on sidewall surfaces of the cavities. The method further includes depositing a first metal layer within the enlarged contact via opening and within the cavities to provide a contact via in contact with the exposed source/drain contact.

20 Claims, 10 Drawing Sheets

(51) Int. Cl.
  *H01L 27/088* (2006.01)
  *H01L 29/78* (2006.01)
  *H01L 29/66* (2006.01)
  *H01L 21/8234* (2006.01)
  *H01L 29/417* (2006.01)
  *H01L 23/528* (2006.01)

(52) U.S. Cl.
  CPC .... *H01L 27/0886* (2013.01); *H01L 29/41791* (2013.01); *H01L 29/66795* (2013.01); *H01L 29/785* (2013.01)

(56) References Cited

U.S. PATENT DOCUMENTS

| | | |
|---|---|---|
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2015/0364420 A1* | 12/2015 | Lin ................ H01L 24/05 257/775 |
| 2019/0148287 A1* | 5/2019 | Chang ............. H01L 23/53295 257/368 |
| 2021/0091190 A1* | 3/2021 | Huang ............. H01L 29/66795 |
| 2021/0134660 A1* | 5/2021 | Wang ............... H01L 21/76804 |

* cited by examiner

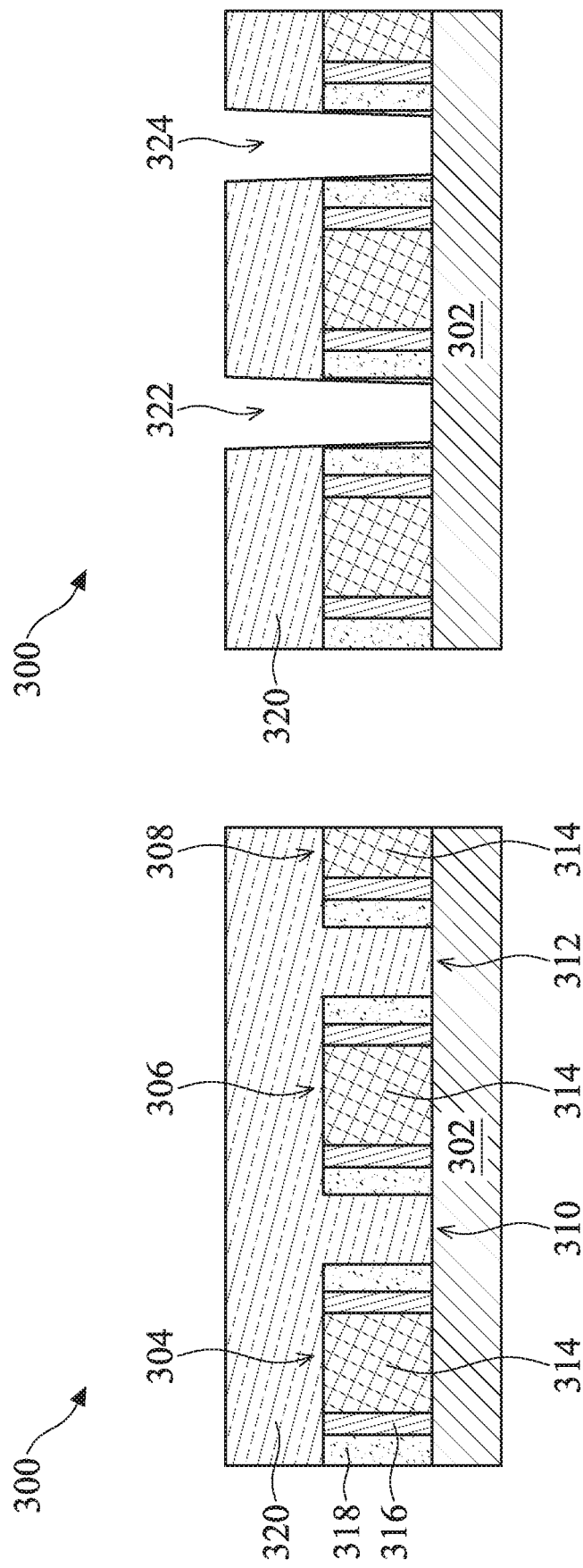

CONTACT FORMATION METHOD AND RELATED STRUCTURE

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As merely one example, forming a reliable contact to a metal gate layer, and to an adjacent source, drain, and/or body region, requires reliable and low resistance via structures such as gate vias and contact vias. For at least some conventional processes, the resistance of such via structures remains a device reliability issue, especially with the continued scaling of IC dimensions. In some cases, a gate via may require a plurality of metal layers (e.g., a primary metal layer and a secondary metal layer) to provide a lower gate via resistance. However, even in such cases, an adjacent contact via may still suffer from high resistance. In other examples, the quality of the metal layer used to form the gate and contact vias may also be degraded due to diffusion of nearby impurities and/or damaged material layers within which the vias are formed.

Thus, existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

FIGS. 3-14 provide cross-sectional views of a device at intermediate stages of fabrication and processed in accordance with the method of FIG. 2, along a plane substantially parallel to a plane defined by section AA' of FIG. 1B, according to some embodiments.

DETAILED DESCRIPTION

Figure 1A:
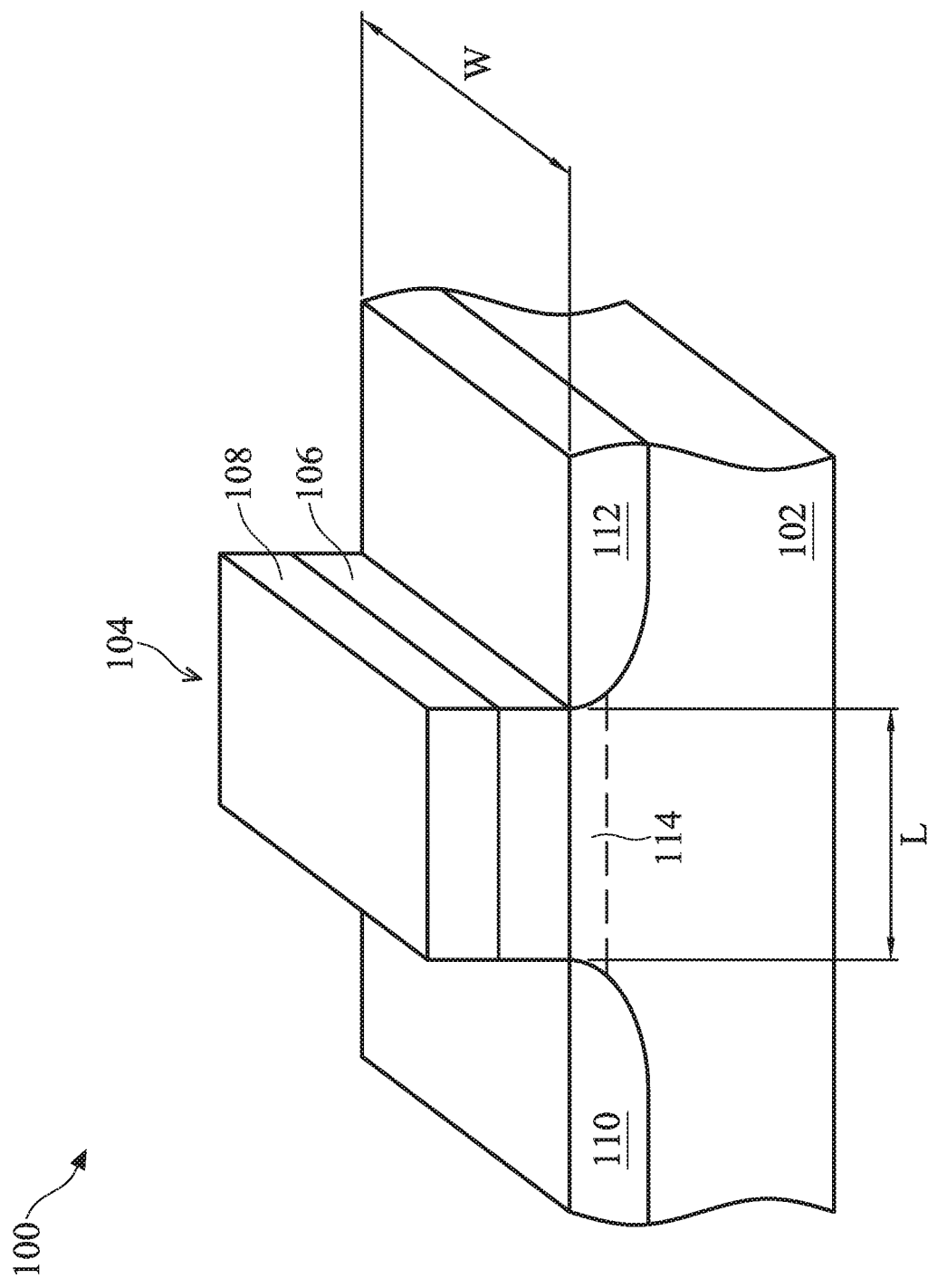
FIG. 1A is a cross-sectional view of an MOS transistor according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of gate and/or contact vias which may be employed in any of a variety of device types. For example, embodiments of the present disclosure may be used to form gate and/or contact vias in planar bulk metal-oxide-semiconductor field-effect transistors (MOSFETs), multi-gate transistors (planar or vertical) such as FinFET devices, gate-all-around (GAA) devices, Omega-gate (Ω-gate) devices, or Pi-gate (Π-gate) devices, as well as strained-semiconductor devices, silicon-on-insulator (SOI) devices, partially-depleted SOI (PD-SOI) devices, fully-depleted SOI (FD-SOI) devices, or other devices as known in the art. In addition, embodiments disclosed herein may be employed in the formation of P-type and/or N-type devices. One of ordinary skill may recognize other embodiments of semiconductor devices that may benefit from aspects of the present disclosure.

With reference to the example of FIG. 1A, illustrated therein is an MOS transistor 100, providing an example of merely one device type which may include embodiments of the present disclosure. It is understood that the exemplary transistor 100 is not meant to be limiting in any way, and those of skill in the art will recognize that embodiments of the present disclosure may be equally applicable to any of a variety of other device types, such as those described above. The transistor 100 is fabricated on a substrate 102 and includes a gate stack 104. The substrate 102 may be a semiconductor substrate such as a silicon substrate. The substrate 102 may include various layers, including conductive or insulating layers formed on the substrate 102. The substrate 102 may include various doping configurations depending on design requirements as is known in the art. The substrate 102 may also include other semiconductors such as germanium, silicon carbide (SiC), silicon germanium (SiGe), or diamond. Alternatively, the substrate 102 may include a compound semiconductor and/or an alloy semiconductor. Further, in some embodiments, the substrate 102 may include an epitaxial layer (epi-layer), the substrate 102 may be strained for performance enhancement, the substrate 102 may include a silicon-on-insulator (SOI) structure, and/or the substrate 102 may have other suitable enhancement features.

The gate stack 104 includes a gate dielectric 106 and a gate electrode 108 disposed on the gate dielectric 106. In some embodiments, the gate dielectric 106 may include an interfacial layer such as silicon oxide layer ($SiO_2$) or silicon oxynitride (SiON), where such interfacial layer may be formed by chemical oxidation, thermal oxidation, atomic layer deposition (ALD), chemical vapor deposition (CVD), and/or other suitable method. In some examples, the gate dielectric 106 includes a high-K dielectric layer such as hafnium oxide ($HfO_2$). Alternatively, the high-K dielectric layer may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. High-K gate dielectrics, as used and described herein, include dielectric materials having a high dielectric constant, for example, greater than that of thermal silicon oxide (~3.9). In still other embodiments, the gate dielectric 106 may include silicon dioxide or other suitable dielectric. The gate dielectric 106 may be formed by ALD, physical vapor deposition (PVD), CVD, oxidation, and/or other suitable methods. In some embodiments, the gate electrode 108 may be deposited as part of a gate first or gate last (e.g., replacement gate) process. In various embodiments, the gate electrode 108 includes a conductive layer such as W, Ti, TiN, TiAl, TiAlN, Ta, TaN, WN, Re, Ir, Ru, Mo, Al, Cu, Co, CoSi, Ni, NiSi, combinations thereof, and/or other suitable compositions. In some examples, the gate electrode 108 may include a first metal material for an N-type transistor and a second metal material for a P-type transistor. Thus, the transistor 100 may include a dual work-function metal gate configuration. For example, the first metal material (e.g., for N-type devices) may include metals having a work function substantially aligned with a work function of the substrate conduction band, or at least substantially aligned with a work function of the conduction band of a channel region 114 of the transistor 100. Similarly, the second metal material (e.g., for P-type devices) may include metals having a work function substantially aligned with a work function of the substrate valence band, or at least substantially aligned with a work function of the valence band of the channel region 114 of the transistor 100. Thus, the gate electrode 104 may provide a gate electrode for the transistor 100, including both N-type and P-type devices. In some embodiments, the gate electrode 108 may alternately or additionally include a polysilicon layer. In various examples, the gate electrode 108 may be formed using PVD, CVD, electron beam (e-beam) evaporation, and/or other suitable process. In some embodiments, sidewall spacers are formed on sidewalls of the gate stack 104. Such sidewall spacers may include a dielectric material such as silicon oxide, silicon nitride, silicon carbide, silicon oxynitride, or combinations thereof.

The transistor 100 further includes a source region 110 and a drain region 112 each formed within the semiconductor substrate 102, adjacent to and on either side of the gate stack 104. In some embodiments, the source and drain regions 110, 112 include diffused source/drain regions, ion implanted source/drain regions, epitaxially grown source/drain regions, or a combination thereof. The channel region 114 of the transistor 100 is defined as the region between the source and drain regions 110, 112 under the gate dielectric 106, and within the semiconductor substrate 102. The channel region 114 has an associated channel length "L" and an associated channel width "W". When a bias voltage greater than a threshold voltage ($V_t$) (i.e., turn-on voltage) for the transistor 100 is applied to the gate electrode 108 along with a concurrently applied bias voltage between the source and drain regions 110, 112, an electric current (e.g., a transistor drive current) flows between the source and drain regions 110, 112 through the channel region 114. The amount of drive current developed for a given bias voltage (e.g., applied to the gate electrode 108 or between the source and drain regions 110, 112) is a function of, among others, the mobility of the material used to form the channel region 114. In some examples, the channel region 114 includes silicon (Si) and/or a high-mobility material such as germanium, which may be epitaxially grown, as well as any of the plurality of compound semiconductors or alloy semiconductors as known in the art. High-mobility materials include those materials with electron and/or hole mobility greater than silicon (Si), which has an intrinsic electron mobility at room temperature (300 K) of around 1350 $cm^2$/V-s and an intrinsic hole mobility at room temperature (300 K) of around 480 $cm^2$/V-s.

Figure 1B:
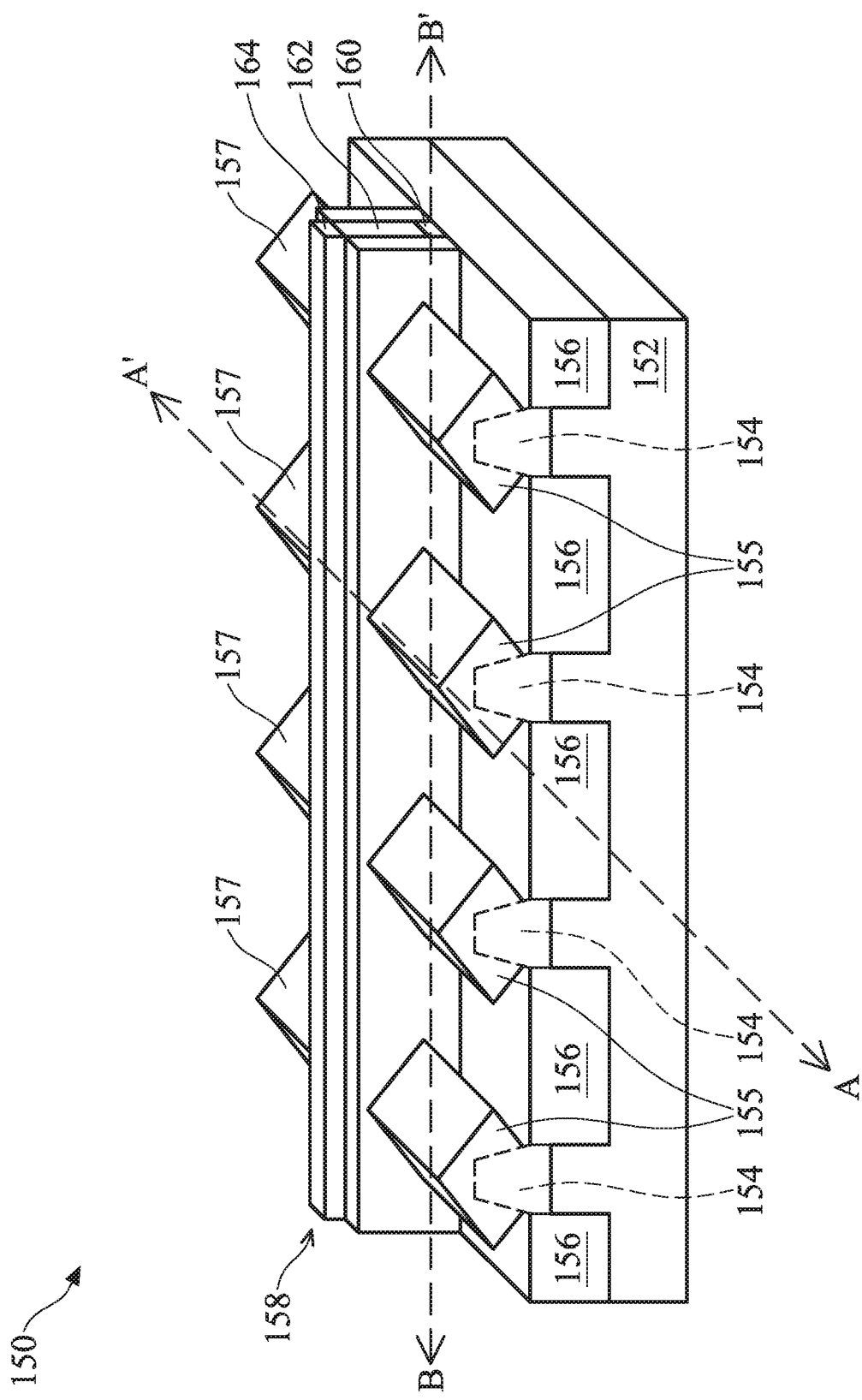
FIG. 1B is perspective view of an embodiment of a FinFET device according to one or more aspects of the present disclosure.

Referring to FIG. 1B, illustrated therein is a FinFET device 150, providing an example of an alternative device type which may include embodiments of the present disclosure. By way of example, the FinFET device 150 includes one or more fin-based, multi-gate field-effect transistors (FETs). The FinFET device 150 includes a substrate 152, at least one fin element 154 extending from the substrate 152, isolation regions 156, and a gate structure 158 disposed on and around the fin element 154. The substrate 152 may be a semiconductor substrate such as a silicon substrate. In various embodiments, the substrate 152 may be substantially the same as the substrate 102 and may include one or more of the materials used for the substrate 102, as described above.

The fin element 154, like the substrate 152, may include one or more epitaxially-grown layers, and may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fin elements 154 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate while an etch process forms recesses into the silicon layer, thereby leaving an extending fin element 154. The recesses may be etched using a dry etch (e.g., chemical oxide removal), a wet etch, and/or other suitable processes. Numerous other embodiments of methods to form the fin elements 154 on the substrate 152 may also be used.

Each of the plurality of fin elements 154 also include a source region 155 and a drain region 157 where the source/drain regions 155, 157 are formed in, on, and/or surrounding the fin element 154. The source/drain regions 155, 157 may be epitaxially grown over the fin elements 154. In addition, a channel region of a transistor is disposed within the fin element 154, underlying the gate structure 158, along a plane substantially parallel to a plane defined by section AA' of FIG. 1B. In some examples, the channel region of the fin element 154 includes a high-mobility material, as described above.

The isolation regions 156 may be shallow trench isolation (STI) features. Alternatively, a field oxide, a LOCOS feature, and/or other suitable isolation features may be implemented on and/or within the substrate 152. The isolation regions 156 may be composed of silicon oxide, silicon nitride, silicon oxynitride, fluorine-doped silicate glass (FSG), a low-k dielectric, combinations thereof, and/or other suitable material known in the art. In an embodiment, the isolation regions 156 are STI features and are formed by etching trenches in the substrate 152. The trenches may then be filled with isolating material, followed by a chemical mechanical polishing (CMP) process. However, other embodiments are possible. In some embodiments, the isolation regions 156 may include a multi-layer structure, for example, having one or more liner layers.

The gate structure 158 includes a gate stack having an interfacial layer 160 formed over the channel region of the fin 154, a gate dielectric layer 162 formed over the interfacial layer 160, and a metal layer 164 formed over the gate dielectric layer 162. In various embodiments, the interfacial layer 160 is substantially the same as the interfacial layer described as part of the gate dielectric 106. In some embodiments, the gate dielectric layer 162 is substantially the same as the gate dielectric 106 and may include high-K dielectrics similar to that used for the gate dielectric 106. Similarly, in various embodiments, the metal layer 164 is substantially the same as the gate electrode 108, described above. In some embodiments, sidewall spacers are formed on sidewalls of the gate structure 158. The sidewall spacers may include a dielectric material such as silicon oxide, silicon nitride, silicon carbide, silicon oxynitride, or combinations thereof.

As discussed above, each of the transistor 100 and FinFET device 150 may include one or more gate and/or contact vias, embodiments of which are described in more detail below. In some examples, the gate and/or contact vias described herein may be part of a local interconnect structure. As used herein, the term "local interconnect" is used to describe the lowest level of metal interconnects and are differentiated from intermediate and/or global interconnects. Local interconnects span relatively short distances and are sometimes used, for example, to electrically connect a source, drain, body, and/or gate of a given device, or those of nearby devices. Additionally, local interconnects may be used to facilitate a vertical connection of one or more devices to an overlying metallization layer (e.g., to an intermediate interconnect layer), for example, through one or more vias. Interconnects (e.g., including local, intermediate, or global interconnects), in general, may be formed as part of back-end-of-line (BEOL) fabrication processes and include a multi-level network of metal wiring. Moreover, any of a plurality of IC circuits and/or devices (e.g., such as the transistor 100 or FinFET 150) may be connected by such interconnects.

With the aggressive scaling and ever-increasing complexity of advanced IC devices and circuits, contact and local interconnect design has proved to be a difficult challenge. By way of example, forming a reliable contact to a metal gate layer, and to an adjacent source, drain, and/or body region, requires reliable and low resistance via structures such as gate vias and contact vias. For at least some conventional processes, the resistance of such via structures remains a device reliability issue, especially with the continued scaling of IC dimensions. In some examples, a gate via may require a plurality of metal layers (e.g., a primary metal layer and a secondary metal layer) to provide a lower gate via resistance. However, even in such cases, an adjacent contact via may still suffer from high resistance. In other examples, the quality of the metal layer used to form the gate and contact vias may also be degraded due to diffusion of nearby impurities and/or damaged material layers within which the vias are formed. Thus, existing methods have not been entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures directed to a fabrication process for contact structures and including gate/contact vias. In at least some embodiments, a selective bottom-up metal-fill methodology is used to provide low contact via resistance. In such a scheme, a contact structure/via may be formed first (e.g., before a gate via) and may include a plurality of metal layers formed using a multi-step process. In some embodiments, selective metal deposition may be used for the contact structure/via, but not for the gate via. In various embodiments, the plurality of metal layers defining the contact structure/via are formed without an intervening barrier layer. As described in more detail below, and prior to selective deposition of the metal providing the contact via, a contact etch stop layer (CESL) lateral etch, oxide re-deposition, and oxide breakthrough (etch) process is performed. Among other advantages, this process may provide improved metal growth quality resulting in reduced contact via resistance, may mitigate issues associated with adjacent defects (e.g., by passivating defects in an adjacent dielectric layer), and may block diffusion of impurities (e.g., from the CESL). In some cases, the disclosed method may also serve to block wet chemical etchants or CMP slurry from attacking the contact structure below the contact via. In some embodiments, the oxide deposited by the oxide re-deposition process may be referred to as a passivation oxide layer, and it may further serve to prevent metal growth on adjacent, defective dielectric sidewall surfaces, thus improving selective metal layer growth. In some examples, the disclosed gate via may employ a Ti/TiN glue layer along a top surface of a metal gate layer to provide oxide layer reduction (e.g., such as native oxide layer reduction) followed by a metal deposition to form the gate via. In various cases, the metal used to form the gate via (e.g., over the glue layer) may include a bulk filled metal layer, an ALD deposited metal layer, or a selective bottom-up metal fill layer (e.g., such as done for the contact via). Additional details of embodiments of the present disclosure are provided below, and additional benefits and/or other advantages will become apparent to those skilled in the art having benefit of the present disclosure.

Figure 2:
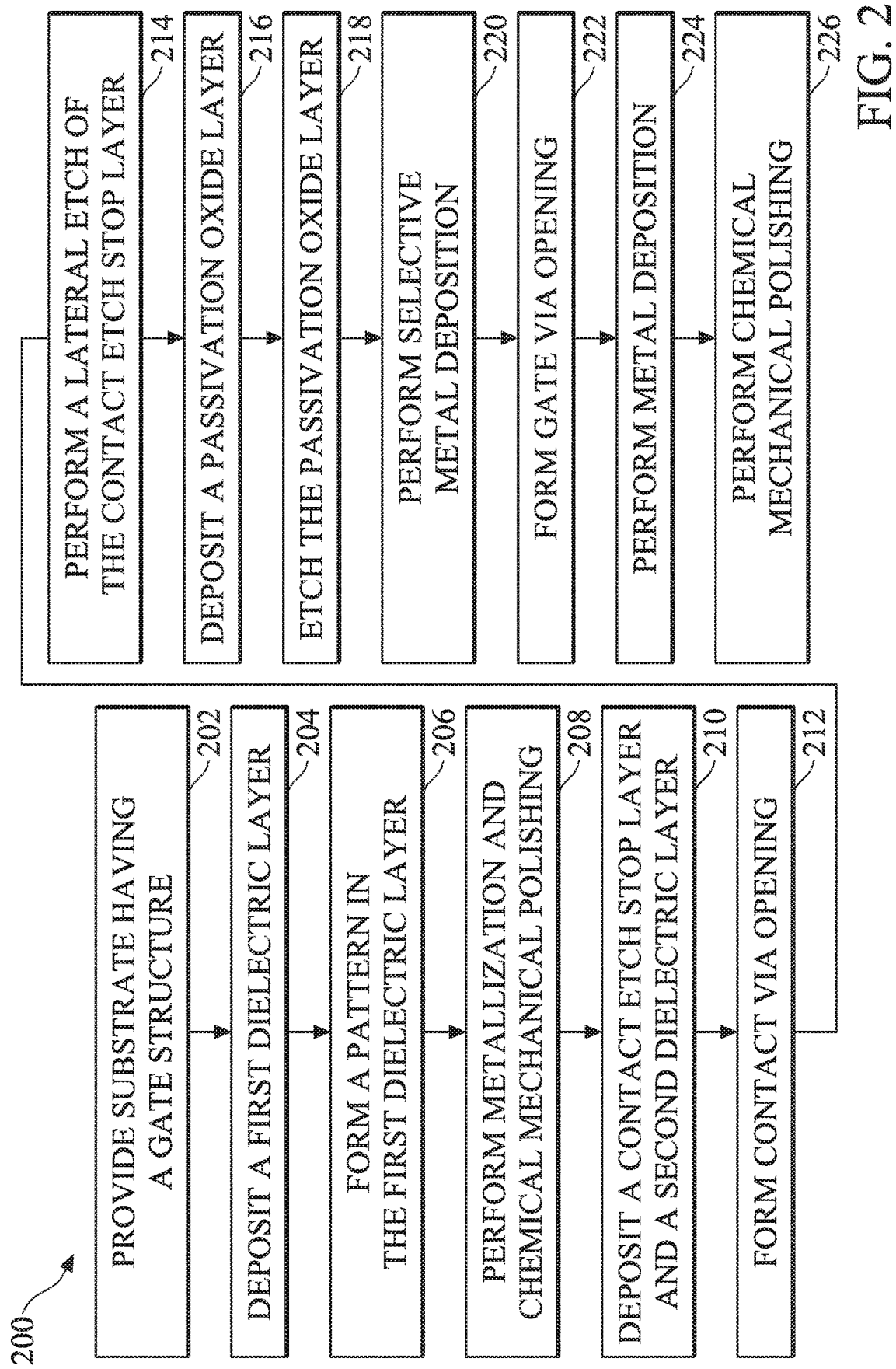
FIG. 2 is a flow chart of a method of forming contact structures and including gate/contact vias, according to some embodiments.

Referring now to FIG. 2, illustrated is a method 200 of forming contact structures and including gate/contact vias, in accordance with some embodiments. The method 200 is described below in more detail with reference to FIGS. 3-14, which provide cross-sectional views of a device 300 along a plane substantially parallel to a plane defined by section AA' of FIG. 1B. The method 200 may be implemented on a single-gate planar device, such as the exemplary transistor 100 described above with reference to FIG. 1A, as well as on a multi-gate device, such as the FinFET device 150 described above with reference to FIG. 1B. Thus, one or more aspects discussed above with reference to the transistor 100 and/or the FinFET 150 may also apply to the method 200. To be sure, in various embodiments, the method 200 may be implemented on other devices such as GAA devices, a-gate devices, or H-gate devices, as well as strained-semiconductor devices, SOI devices, PD-SOI devices, FD-SOI devices, or other devices as known in the art.

It is understood that parts of the method 200 and/or any of the exemplary transistor devices discussed with reference to the method 200 may be fabricated by a well-known complementary metal-oxide-semiconductor (CMOS) technology process flow, and thus some processes are only briefly described herein. Further, it is understood that any exemplary transistor devices discussed herein may include various other devices and features, such as additional transistors, bipolar junction transistors, resistors, capacitors, diodes, fuses, etc., but are simplified for a better understanding of the inventive concepts of the present disclosure. Further, in some embodiments, the exemplary transistor device(s) disclosed herein may include a plurality of semiconductor devices (e.g., transistors), which may be interconnected. In addition, in some embodiments, various aspects of the present disclosure may be applicable to either one of a gate-last process or a gate-first process.

In addition, in some embodiments, the exemplary transistor devices illustrated herein may include a depiction of a device at an intermediate stage of processing, as may be fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), MOSFETs, CMOS transistors, bipolar transistors, high voltage transistors, high frequency transistors, other memory cells, and/or combinations thereof.

The method 200 begins at block 202 where a substrate having a gate structure is provided. With reference to FIG. 3, and in an embodiment of block 202, a device 300 having a substrate 302 and including gate structures 304, 306, 308 is provided. In some embodiments, the substrate 302 may be substantially the same as either of the substrates 102, 152, described above. A region of the substrate 302 upon which the gate structures 304, 306, 308 are formed, and including regions of the substrate 302 between adjacent gate structures 304, 306, 308, may include an active region of the substrate 302. It will be understood that the device 300 is merely illustrative and is provided for clarity of discussion with respect to the method 200. For example, in some cases, the device 300 may include a planar device, such as the transistor 100. Alternatively, in some examples, the device 300 may include a multi-gate device, such as the FinFET 150. Moreover, in some cases, the device 300 may include a GAA device, an a-gate device, a H-gate device, a strained-semiconductor device, an SOI device, a PD-SOI device, a FD-SOI device, or other device as known in the art. In some embodiments, the device 300 includes regions 310, 312, adjacent to the gate structures 304, 306, 308, where the regions 310, 312 may include a source region, a drain region, or a body contact region. In various embodiments, each of the gate structures 304, 306, 308 may include an interfacial layer formed over the substrate 302, a gate dielectric layer formed over the interfacial layer, and a metal gate (MG) layer 314 formed over the gate dielectric layer. In some embodiments, each of the interfacial layer, the dielectric layer, and the metal gate layer 314 of the gate structures 304, 306, 308 may be substantially the same as those described above with respect to the transistor 100 and the FinFET 150. In addition, each of the gate structures 304, 306, 308 may include sidewall spacer layers 316, 318. In some cases, each of the sidewall spacer layers 316, 318 include materials having different dielectric constant values (e.g., K values). In various embodiments, the sidewall spacer layers 316, 318 include $SiO_x$, SiN, $SiO_xN_y$, $SiC_xN_y$, $SiO_xC_yNZ$, $AlO_x$, $AlO_xN_y$, AlN, HfO, ZrO, HfZrO, CN, poly-Si, combinations thereof, or other suitable dielectric materials. In some embodiments, the sidewall spacer layers 316, 318 include multiple layers, such as main spacer walls, liner layers, and the like. By way of example, the sidewall spacer layers 316, 318 may be formed by depositing a dielectric material over the device 300 and anisotropically etching back the dielectric material. In some embodiments, the etch-back process (e.g., for spacer formation) may include a multiple-step etching process to improve etch selectivity and provide over-etch control.

The method 200 proceeds to block 204 where a first dielectric layer is deposited over the substrate. Still referring to FIG. 3, and in an embodiment of block 204, a dielectric layer 320 is formed over the substrate 302 and over each of the gate structures 304, 306, 308. By way of example, the dielectric layer 320 may include an inter-layer dielectric (ILD) layer that may include materials such as tetraethylorthosilicate (TEOS) oxide, undoped silicate glass, or doped silicon oxide such as borophosphosilicate glass (BPSG), fluorosilicate glass (FSG), phosphosilicate glass (PSG), boron doped silicon glass (BSG), and/or other suitable dielectric materials. The dielectric layer 320 may be deposited by a subatmospheric CVD (SACVD) process, a flowable CVD process, or other suitable deposition technique.

The method 200 proceeds to block 206 where a pattern is formed in the dielectric layer. With reference to FIGS. 3 and 4, and in an embodiment of block 206, a pattern, that includes openings 322, 324, is formed within the dielectric layer 320. In some cases, the openings 322, 324 provide access to regions 310, 312, adjacent to the gate structures 304, 306, 308, where the regions 310, 312 may include a source region, a drain region, or a body contact region. By way of example, the openings 322, 324 may be formed by a suitable combination of lithographic patterning and etching (e.g., wet or dry etching) processes. In some cases, the openings 322, 324 may be referred to as metal plug openings, contact plug openings, or plug openings.

Figure 5:
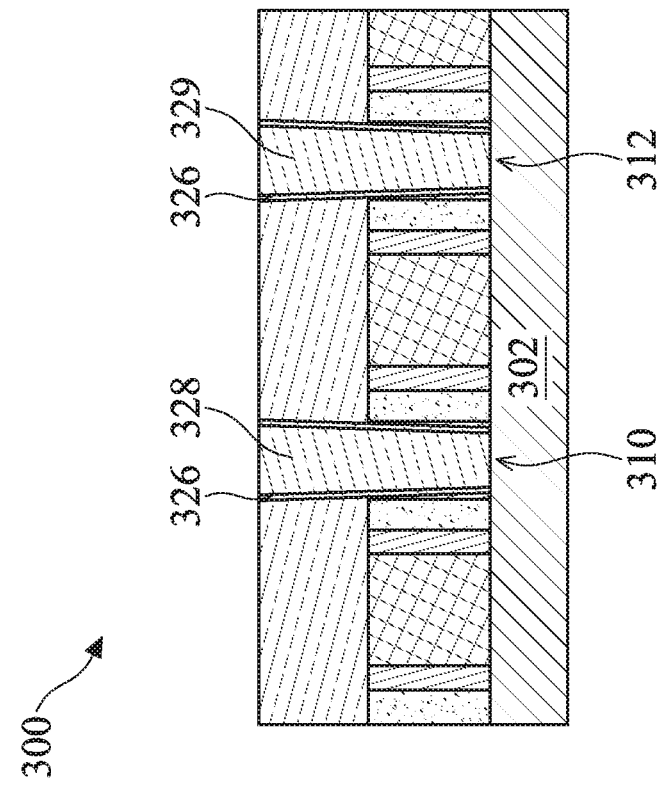

The method 200 proceeds to block 208 where metallization and chemical mechanical polishing processes are performed. With reference to FIGS. 4 and 5, and in an embodiment of block 208, a silicidation process may initially be performed to form a silicide layer on exposed portions of the substrate 302 (e.g., exposed by the openings 322, 324) in the regions 310, 312, thus providing a low resistance contact thereto. In some examples, and in a further embodiment of block 208, a glue or barrier layer 326 may be formed on sidewall surfaces within each of the openings 322, 324. In some cases, the glue or barrier layer 326 may include Ti, TiN, Ta, TaN, W, or other appropriate material. Additionally, and in an embodiment of block 208, metal layers 328, 329 may be formed within each of the openings 322, 324 after formation of the glue or barrier layer 326. In some examples, the metal layers 328, 329 may include W, Cu, Co, Ru, Al, Rh, Mo, Ta, Ti, TiN, TaN, WN, silicides, or other suitable conductive material. In some cases, the metal layers 328 and 329 may include the same material and may deposited together as part of a single deposition process. In some cases, the metal layers 328, 329 may be referred to as metal plugs, contact plugs, plugs, or source/drain contacts. After deposition of the metal layers 328, 329, and in an embodiment of block 208, a CMP process may be performed to remove excess material and planarize the top surface of the device 300.

Figure 6:
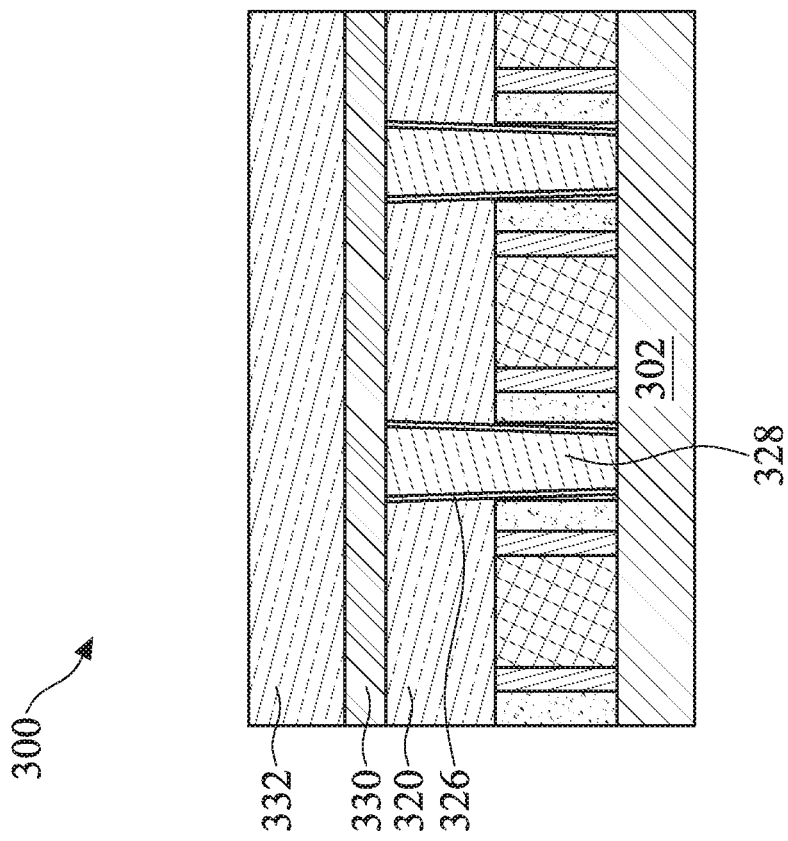

The method 200 proceeds to block 210 where a contact etch stop layer and a second dielectric layer are deposited over the substrate. Referring to FIGS. 5 and 6, and in an embodiment of block 210, a contact etch stop layer (CESL) 330 is formed over the substrate 302, and a dielectric layer 332 is formed over the contact etch stop layer 330. By way of example, the contact etch stop layer 330 may include Ti, TiN, TiC, TiCN, Ta, TaN, TaC, TaCN, W, WN, WC, WCN, TiAl, TiAlN, TiAlC, TiAlCN, or combinations thereof. In some embodiments, the dielectric layer 332 may include an ILD layer that may include materials such as TEOS oxide, undoped silicate glass, or doped silicon oxide such as BPSG, FSG, PSG, BSG, and/or other suitable dielectric materials. Thus, in some cases, the dielectric layer 332 may be substantially the same as the dielectric layer 320. In various embodiments, the CESL 330 and the dielectric layer 332 may be deposited by a SACVD process, a flowable CVD process, an ALD process, a PVD process, or other suitable deposition technique.

Figure 7:
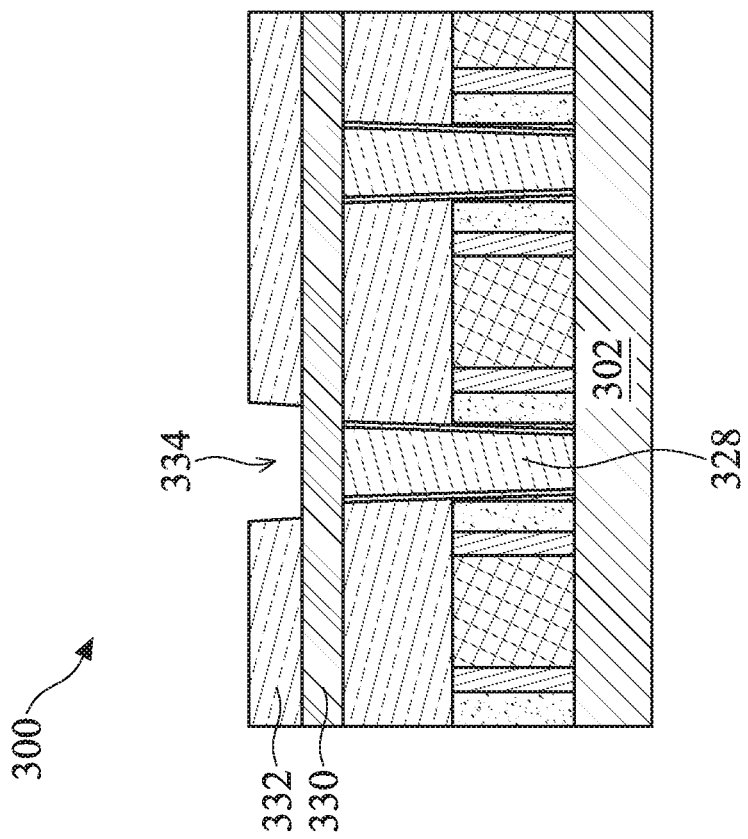

The method 200 proceeds to block 212 where a contact via opening is formed. With reference to FIGS. 6 and 7, and in an embodiment of block 212, a contact via opening 334 is formed within the dielectric layer 332. By way of example, the contact via opening 334 may be formed by a suitable combination of lithographic patterning and etching (e.g., wet or dry etching) processes. In some embodiments, the etching process used to etch the dielectric layer 332 may stop on the CESL 330. Stated another way, the etching process may include a selective etching process that etches the dielectric layer 332 without substantially etching the CESL 330. Thus, formation of the contact via opening 334 may serve to expose a portion of the underlying CESL 330. In some embodiments, the contact via opening 334 may be substantially aligned (e.g., centered) with the metal layer 328 that is beneath the contact via opening 334. In contrast to at least some existing implementations, the contact via opening 334 is formed before gate via openings (e.g., which provide access to metal gate layers of the gate structures), formation of which is discussed further below.

Figure 8:
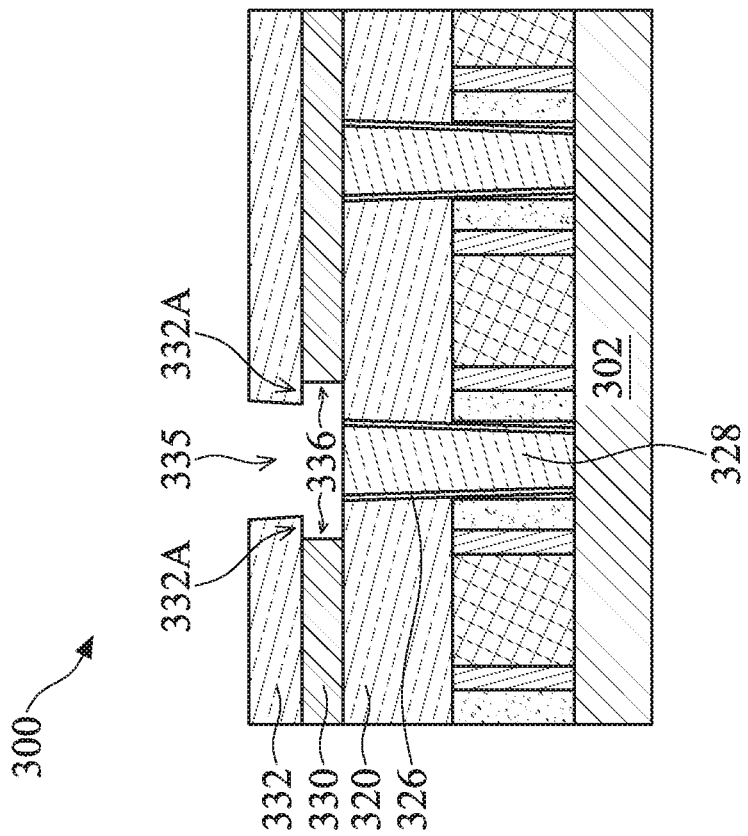

The method 200 proceeds to block 214 where a lateral etch of the CESL is performed. With reference to FIGS. 7 and 8, and in an embodiment of block 214, an etching process is performed to etch the portion of the CESL 330 exposed by formation of the contact via opening 334 (block 212), as well as adjacent lateral portions of the CESL 330, to form an enlarged contact via opening 335 and including cavities 336. In some examples, the adjacent lateral portions of the CESL 330 may include portions of the CESL 330, on opposing sides of the portion of the CESL 330 exposed by the contact via opening 334, not previously exposed by the contact via opening 334. Thus, in some embodiments, formation of the cavities 336 by the lateral etch of the CESL 330 may also form dielectric overhang regions 332A disposed over the cavities 336. In different terms, the lateral etch of the CESL 330 results in a bottom portion of the enlarged contact via opening 335 having lateral protrusions corresponding to the cavities 336. Such lateral protrusions may be wider than a width of the tapered profile of a top portion of the enlarged contact via opening 335. The lateral protrusions may also be wider than a width of the metal layer 328, at least along the direction substantially parallel to section AA' of FIG. 1B. In various examples, the etching process of block 214 may further serve to expose portions of the underlying dielectric layer 320, the glue or barrier layer 326, and the metal layer 328. The etching process of block 214 may include a wet etching process, a dry etching process, or a combination thereof. In some embodiments, the etching process of block 214 may be selective to the CESL 330. Stated another way, the etching process of block 214 may etch the CESL 330 without substantially etching other nearby layers (e.g., such as the dielectric layer 320, the glue or barrier layer 326, the metal layer 328, or the dielectric layer 332).

Figure 9:
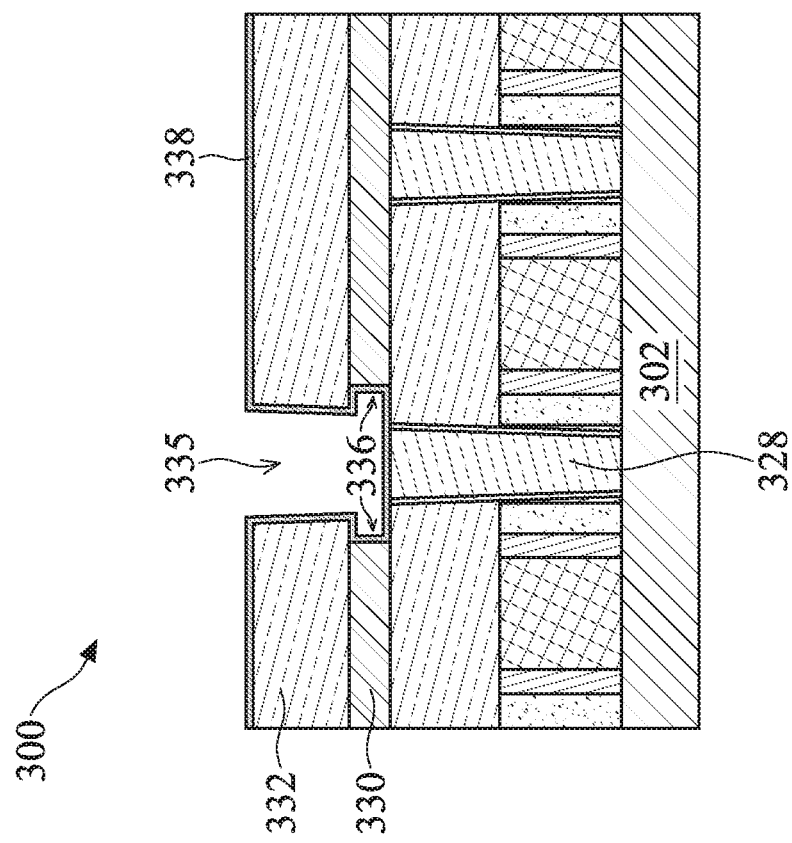

The method 200 proceeds to block 216 where a passivation oxide layer is deposited. Referring to FIGS. 8 and 9, and in an embodiment of block 216, a passivation oxide layer 338 is formed over the substrate 302. In some cases, deposition of the passivation oxide layer 338 may be referred to as an oxide re-deposition process. By way of example, the passivation oxide layer 338 may be deposited on a top surface of the device 300, on sidewall surfaces of the enlarged contact via opening 335, on sidewall surfaces of the cavities 336, and along a bottom surface of the enlarged contact via opening 335. The passivation oxide layer 338 may, in various examples, serve to passivate defects which may be present on the exposed surfaces upon which the passivation oxide layer 338 is deposited (e.g., such as defects present on sidewall surfaces of the enlarged contact via opening 335 and/or on sidewall surfaces of the cavities 336). In some examples, the deposited passivation oxide layer 338 may serve to prevent selective metal growth (e.g., during a subsequent process) on adjacent, defective surfaces, and may also serve to block diffusion of impurities (e.g., from the CESL 330). Thus, the quality of the metal layer subsequently deposited, for formation of the contact via, is improved. In some embodiments, the passivation oxide layer 338 may include materials such as $SiO_2$, $AlO_x$, $HfO_x$, $ZrO_x$, or other suitable material. In various embodiments, the passivation oxide layer 338 may be deposited by a CVD process, an ALD process, an O2 treatment process (e.g., such as a wet or dry thermal oxidation process), or other suitable deposition technique.

Figure 10:
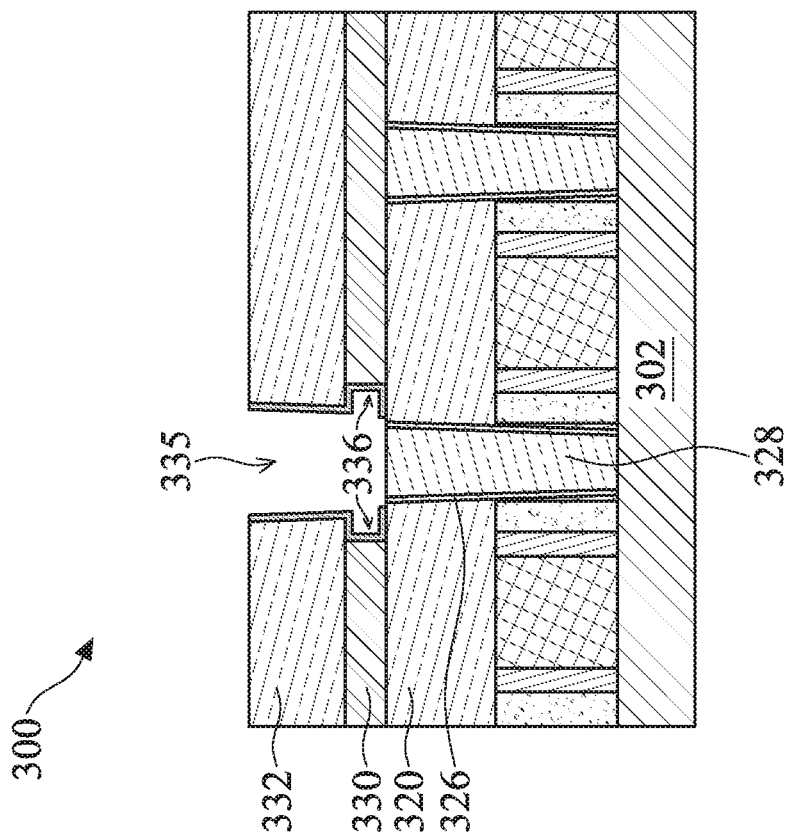

The method 200 proceeds to block 218 where the passivation oxide layer is etched. With reference to FIGS. 9 and 10, and in an embodiment of block 218, an etching process is performed to etch portions of the passivation oxide layer 338 to expose at least the underlying metal layer 328, to which a subsequent electrical connection will be made, as discussed below. In some cases, etching of the passivation oxide layer 338 may be referred to as an oxide breakthrough process. In some embodiments, the etching process of block 218 may also expose portions of the glue or barrier layer 326, portions of the dielectric layer 320, and may also serve to remove the passivation oxide layer 338 from a top surface of the device 300. In some embodiments, the etching process may leave the passivation oxide layer 338 on sidewall surfaces of the enlarged contact via opening 335 and on sidewall surfaces of the cavities 336 substantially unetched. Thus, after the etching process of block 218, the passivation oxide layer 338 may remain disposed on sidewall surfaces of the enlarged contact via opening 335 and on sidewall surfaces of the cavities 336. The etching process of block 218 may include a wet etching process, a dry etching process, or a combination thereof. In some embodiments, the etching process of block 218 may be selective to the passivation oxide layer 338. However, in some cases, the etching process of block 218 may also etch portions of the underlying dielectric layer 320, the glue or barrier layer 326, and the metal layer 328 along the bottom surface of the enlarged contact via opening 335, for example, to ensure complete breakthrough of the passivation oxide layer 338.

Figure 11:
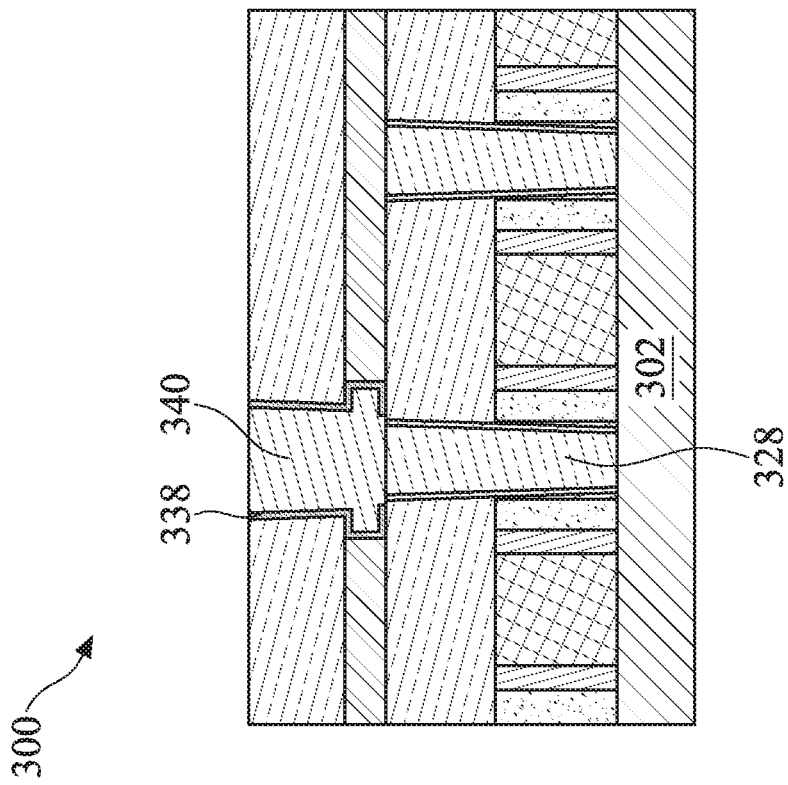

The method 200 proceeds to block 220 where a selective metal deposition process is performed. With reference to FIGS. 10 and 11, and in an embodiment of block 220, a metal layer 340 is formed within the enlarged contact via opening 335 and within the cavities 336. In particular, the metal layer 340 is selectively grown on, and is in direct contact with, the metal layer 328 to provide a low-resistance electrical connection thereto. Thus, in various embodiments, there is no barrier layer between the metal layer 340 and the metal layer 328. In various examples, the metal layer 340 may provide a contact via, where the contact via provides the electrical connection to the metal layer 328. It is also noted that formation of the metal layer 340 fills the enlarged contact via opening 335 (and the cavities 336) from the bottom-up by selective growth on the metal layer 328, thereby providing a selective bottom-up metal-fill methodology for the contact via (e.g., for the metal layer 340). It is also noted that the contact via (the metal layer 340) and the passivation oxide layer 338 define an inverted T-shape, that among other advantages, may serve to block wet chemical etchants or CMP slurry from attacking the metal layer 328. In some examples, the metal layer 340 may include W, Cu, Co, Ru, Al, Rh, Mo, Ta, Ti, or other conductive material. By way of example, selective deposition of the metal layer 340 may be performed using a selective CVD technique. The lack of a barrier layer between the metal layer 340 and the metal layer 328, and the larger area bottom region of the contact via provided by the inverted T-shape, helps to provide the contact via with a low resistance. In some cases, and after selective deposition of the metal layer 340, a CMP process may be performed to remove excess material and planarize the top surface of the device 300. If a CMP process is performed at this stage, the metal layer 328 will remain protected by the inverted T-shape of the contact via (the metal layer 340) and the passivation oxide layer 338, as noted above.

Figure 12:
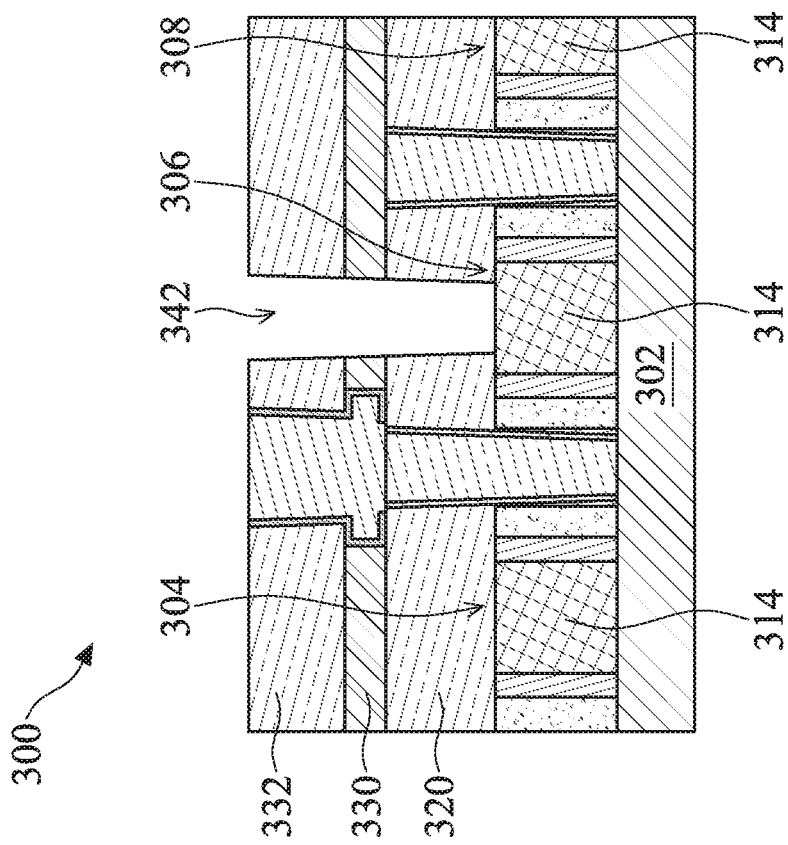

The method 200 proceeds to block 222 where a gate via opening is formed. With reference to FIGS. 11 and 12, and in an embodiment of block 222, a gate via opening 342 is formed. By way of example, the gate via opening 342 exposes, and thus provides access to, the metal gate layer 314 of the gate structure 306. By way of example, the gate via opening 342 may be formed by a suitable combination of lithographic patterning and etching (e.g., wet or dry etching) processes. In some embodiments, one or more etching processes may be used to etch through each of the dielectric layer 332, the contact etch stop layer 330, and the dielectric layer 320, in sequence. In various embodiments, the gate via opening 342 is substantially aligned (e.g., centered) with the metal gate layer 314 of the gate structure 306. In addition, it will be understood that similar gate via openings may be formed to provide access to the metal gate layer 314 of the gate structures 304, 308, or to other gate structures not explicitly shown.

Figure 13:
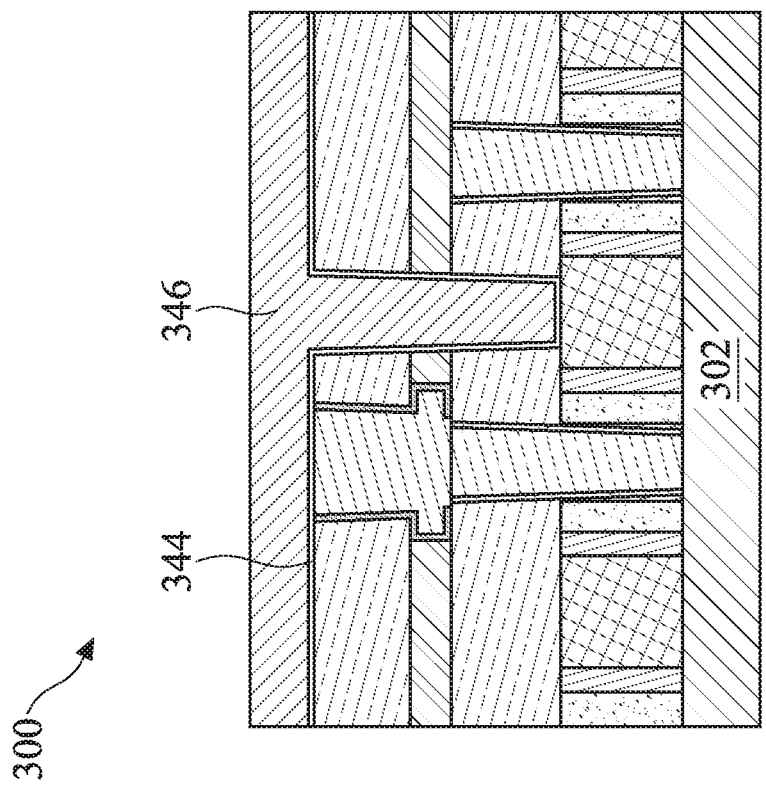

The method 200 proceeds to block 224 where a metal deposition process is performed. With reference to FIGS. 12 and 13, and in an embodiment of block 224, a glue or barrier layer 344 may be formed over the device 300, including within the gate via opening 342. In particular, and in various embodiments, the glue or barrier layer 344 is deposited along a top surface of the metal gate layer 314 (of the gate structure 306) to provide oxide layer reduction (e.g., such as native oxide layer reduction), and in some cases to substantially prevent formation of an oxide layer, along the top surface of the metal gate layer 314. In some cases, the glue or barrier layer 344 may include Ti, TiN, Ta, TaN, W, or other appropriate material. Additionally, and in an embodiment of block 224, a metal layer 346 may be formed on the glue or barrier layer 344 over the device 300 and within the gate via opening 342. In some examples, the metal layer 346 may include W, Cu, Co, Ru, Al, Rh, Mo, Ta, Ti, or other conductive material. In various cases, the metal layer 346 may include a bulk filled metal layer, an ALD deposited metal layer, or a selective bottom-up metal fill layer (e.g., such as done for the contact via).

Figure 14:
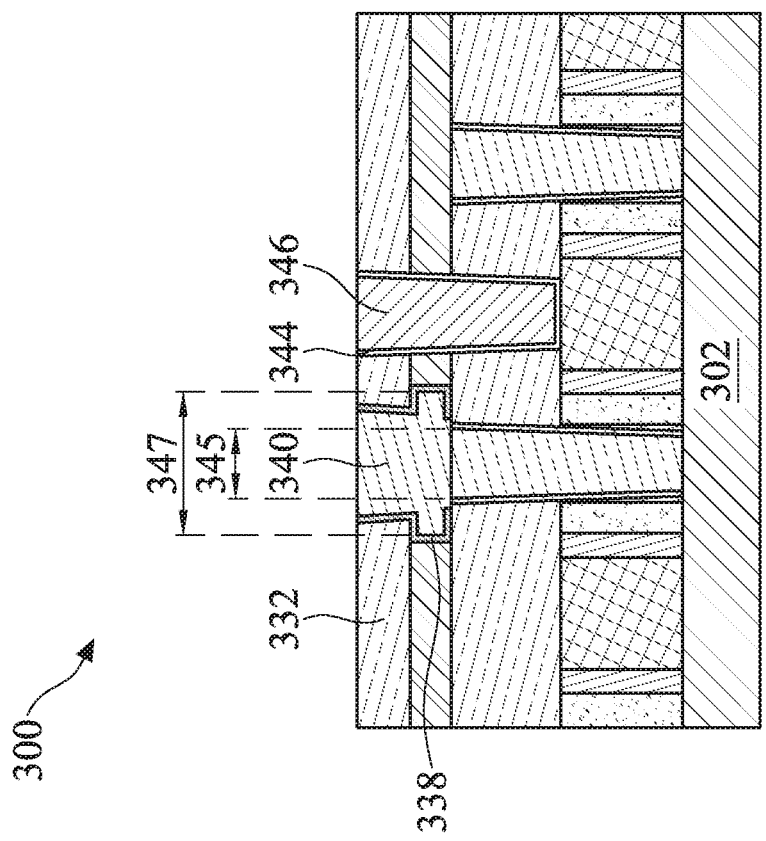

The method 200 proceeds to block 226 where a CMP process is performed. With reference to FIGS. 13 and 14, after deposition of the metal layer 346 and in an embodiment of block 226, a CMP process may be performed to remove excess material and planarize the top surface of the device 300. In various embodiments, the CMP process may be performed until the portions of the metal layer 346 and the glue or barrier layer 344 that are outside of the gate via opening 342 are removed. In other words, the CMP process is performed until the top surfaces of dielectric layer 332 and the metal layer 340 become exposed. These upper surfaces are co-planar with the upper surface of the remaining portion of the metal layer 346, which defines a gate via that provides electrical connectivity to the underlying metal gate layer 314 of the gate structure 306. It is noted that in contrast to at least some existing embodiments, which may require a plurality of metal layers (e.g., primary and secondary metal layers) to provide a lower gate via resistance, embodiments of the present disclosure are configured to provide low gate via resistance with a single metal layer (the metal layer 346) while also providing a low contact via (the metal layer 340) resistance by the selective bottom-up metal-fill methodology disclosed herein.

As previously noted, and because of the inverted T-shape of the contact via (the metal layer 340) and the passivation oxide layer 338, the metal layer 328 (the source/drain contact) will remain protected from wet chemical etchants or CMP slurry introduced during the CMP process of block 226. In other words, the lateral protrusions of the contact via may serve to block such wet chemical etchants or CMP slurry during the CMP process. Elaborating on the inverted T-shape of the contact via, reference is made to FIG. 15 which provides a cross-sectional view of the device 300 along a plane substantially parallel to a plane defined by section BB' of FIG. 1B, as opposed to the plane defined by section AA' as in FIGS. 3-14. In other words, whereas FIGS. 3-14 illustrate an X-cut cross-section, FIG. 15 illustrates a Y-cut cross-section.

Figure 15:
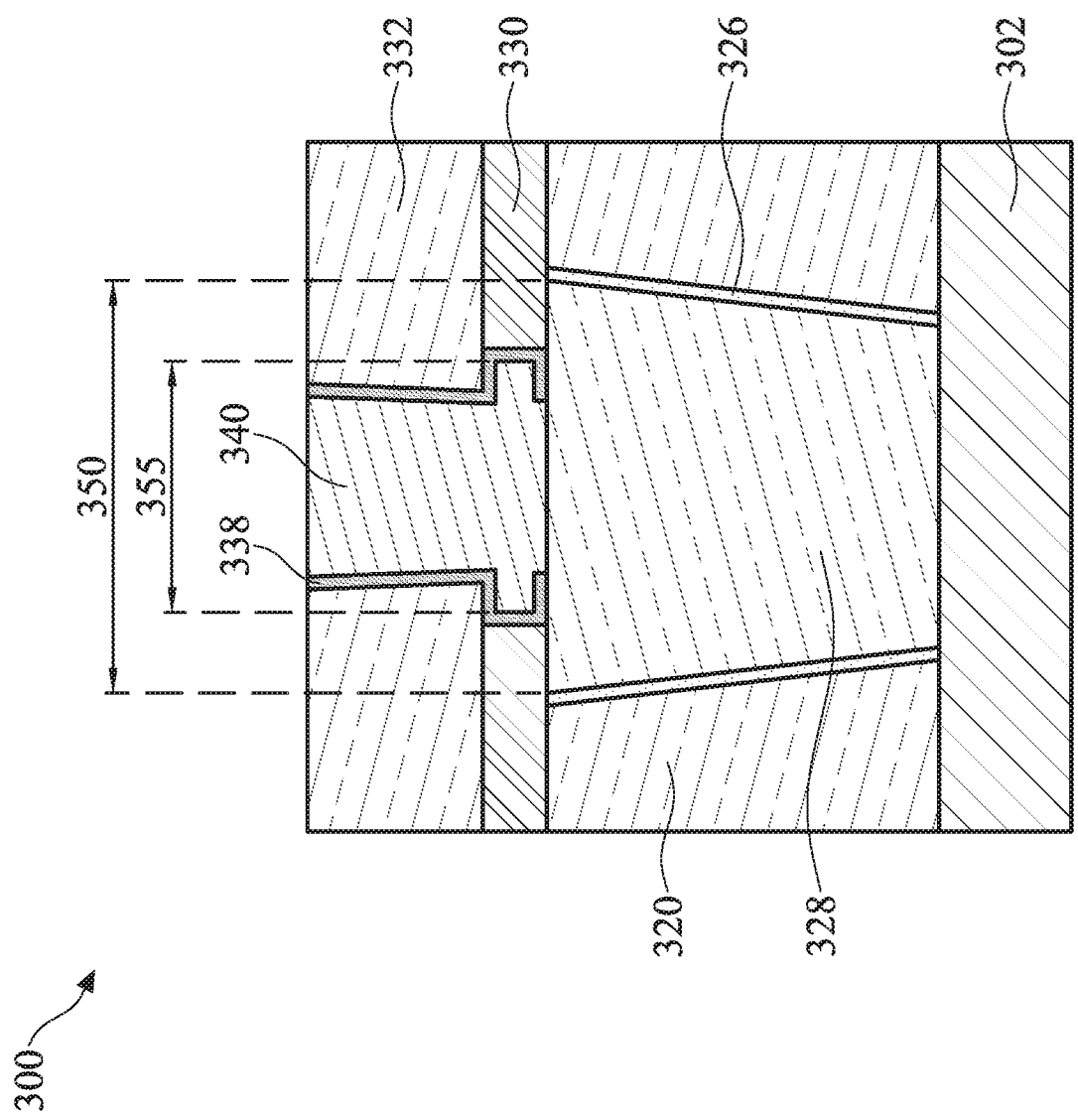
FIG. 15 provides a cross-sectional view of a device fabricated according to the method of FIG. 2, along a plane substantially parallel to a plane defined by section BB' of FIG. 1B, in accordance with some embodiments.

Referring to FIG. 15, the metal layer 340 (the contact via) is formed over the metal layer 328 (the source/drain contact), as discussed above. However, the metal layer 328 has a much larger lateral dimension in the Y-direction (as in the Y-cut cross-section) than in the X-direction (as in the X-cut cross-section). For example, the metal layer 328 (the source/drain contact) has a maximum lateral dimension 350 in the Y-direction, which is substantially greater than its maximum dimension 345 in the X-direction (see FIG. 14). Meanwhile, the metal layer 340 (the contact via) has a maximum lateral dimension 355 in the Y-direction and a maximum lateral dimension 347 in the X-direction (see FIG. 14). As shown, the lateral dimension 347 is larger than the dimension 345. On the other hand, the lateral dimension 355 is smaller than the dimension 350. However, although the dimension 355 is smaller than the dimension 350, the interface of the metal layer 340 and the metal layer 328 still provides a relatively gradual transition in size. In comparison, the bottom surface of conventional contact vias would be much smaller than the upper surface of the source/drain contact in the Y-direction, since conventional contact vias lack the laterally protruding bottom profile. As such, conventional schemes would have entailed a drastic change from a relatively wide source/drain contact to a very narrow contact via. Such a drastic size change is undesirable as it could lead to defects (e.g., broken vias) or other fabrication related difficulties. Here, since the bottom portion of the contact via (the metal layer 340) is much wider than conventional contact vias, it allows a more gradual transition from the source/drain contact (the metal layer 328) to the contact via (the metal layer 340), which reduces potential defects or fabrication problems.

The device 300 may undergo further processing to form various features and regions known in the art. For example, subsequent processing may form various contacts/vias/lines and multilayers interconnect features (e.g., metal layers and interlayer dielectrics) on the substrate 302, configured to connect the various features (e.g., including the contact via and the gate via) to form a functional circuit that may include one or more devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be replaced or eliminated in accordance with various embodiments of the method 200.

The various embodiments described herein offer several advantages over the existing art. It will be understood that not all advantages have been necessarily discussed herein, no particular advantage is required for all embodiments, and other embodiments may offer different advantages. As one example, embodiments discussed herein include methods and structures directed to a fabrication process for contact structures and including gate/contact vias. In at least some embodiments, a selective bottom-up metal-fill methodology is used to provide low contact via resistance, where a contact structure/via may be formed first (e.g., before a gate via). In various embodiments, the plurality of metal layers defining the contact structure/via are formed without an intervening barrier layer, providing for improved (lower) resistance. In some embodiments, and prior to selective deposition of the metal providing the contact via, a CESL lateral etch, oxide re-deposition, and oxide breakthrough (etch) process is performed. Among other advantages, this process may provide improved metal growth quality resulting in reduced contact via resistance, may mitigate issues associated with adjacent defects (e.g., by passivating defects in an adjacent dielectric layer), and may block diffusion of impurities (e.g., from the CESL). Formation of a metal layer to form a contact via (e.g., after the CESL lateral etch) also serves to provide a contact via having a laterally protruding bottom profile, as discussed above. In some cases, the laterally protruding bottom profile of the contact via may serve to block wet chemical etchants or CMP slurry from attacking the contact structure below the contact via. In some embodiments, the oxide deposited by the oxide re-deposition process includes a passivation oxide layer that serves to prevent metal growth on adjacent, defective dielectric sidewall surfaces, thus improving selective metal layer growth. In some examples, the disclosed gate via may employ a Ti/TiN glue layer along a top surface of a metal gate layer to provide oxide layer reduction (e.g., such as native oxide layer reduction) followed by a metal deposition to form the gate via. Thus, the various embodiments disclosed herein provide for higher quality and more robust contact structures and gate/contact vias, which further provides for improved device and circuit performance.

Thus, one of the embodiments of the present disclosure described a method for fabricating a semiconductor device including forming a contact via opening in a first dielectric layer, where the contact via opening exposes a first portion of a contact etch stop layer (CESL). The method further includes etching both the first portion of the CESL exposed by the contact via opening and adjacent lateral portions of the CESL to expose a source/drain contact and form an enlarged contact via opening having cavities disposed on either side of a bottom portion of the enlarged contact via opening. The method further includes forming a passivation layer on sidewall surfaces of the enlarged contact via opening including on sidewall surfaces of the cavities. The method further includes depositing a first metal layer within the enlarged contact via opening and within the cavities to provide a contact via in contact with the exposed source/drain contact.

In another of the embodiments, discussed is a method including forming a first metal layer in contact with a source/drain region adjacent to a gate structure. The method further includes depositing an etch stop layer over the first metal layer and over the gate structure and depositing an inter-layer dielectric (ILD) layer over the etch stop layer. The method further includes etching the etch stop layer and the ILD layer in a region over the first metal layer to form a first opening that exposes the first metal layer. The first opening has a bottom portion including lateral protrusions and a top portion disposed over the bottom portion, and where the bottom portion is wider than the top portion. The method further includes depositing an oxide layer on sidewall surfaces of the first opening and selectively depositing a second metal layer onto the exposed first metal layer within the first opening to form a contact via.

In yet another of the embodiments, discussed is a semiconductor device including a source/drain contact adjacent to a gate structure and a first via disposed over the source/drain contact. The first via has a bottom portion including lateral protrusions on opposing sides of the bottom portion and a top portion disposed over the bottom portion. The first via includes a passivation oxide layer along sidewalls of the first via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    forming a contact via opening in a dielectric layer, wherein the contact via opening exposes a first portion of a contact etch stop layer (CESL);
    etching both the first portion of the CESL exposed by the contact via opening and adjacent lateral portions of the CESL to expose a source/drain contact and form an enlarged contact via opening having cavities disposed on either side of a bottom portion of the enlarged contact via opening;

forming a passivation layer on sidewall surfaces of the enlarged contact via opening including on sidewall surfaces of the cavities; and depositing a first metal layer within the enlarged contact via opening and within the cavities to provide a contact via in contact with the exposed source/drain contact.

2. The method of claim 1, wherein the contact via includes lateral protrusions on either side of a bottom portion of the contact via that correspond to the cavities.

3. The method of claim 2, wherein the bottom portion including the lateral protrusions has a first width that is greater than a second width of the source/drain contact along a first direction; and wherein the bottom portion including the lateral protrusions has a third width that is less than a fourth width of the source/drain contact along a second direction perpendicular to the first direction.

4. The method of claim 1, wherein the contact via is substantially aligned with the source/drain contact.

5. The method of claim 1, further comprising:
etching the dielectric layer and a second portion of the CESL to form a gate via opening, wherein the gate via opening exposes a metal gate layer of a gate structure adjacent to the source/drain contact; and depositing a second metal layer within the gate via opening to provide a gate via in contact with the exposed metal gate layer.

6. The method of claim 5, further comprising:
after depositing the second metal layer, performing a chemical mechanical polishing process until top surfaces of the dielectric layer and the first metal layer are exposed.

7. The method of claim 6, wherein the contact via includes lateral protrusions on either side of a bottom portion of the contact via that correspond to the cavities, and wherein the lateral protrusions prevent CMP slurry introduced during the chemical mechanical polishing process from attacking the source/drain contact.

8. The method of claim 1, wherein the passivation layer includes an oxide layer that passivates a defect on the sidewall surfaces of the enlarged contact via opening or on the sidewall surfaces of the cavities.

9. The method of claim 1, wherein the passivation layer blocks diffusion of impurities from the CESL.

10. The method of claim 1, wherein the depositing the first metal layer includes depositing the first metal layer by selectively growing the first metal layer directly on the exposed source/drain contact.

11. A method of fabricating a semiconductor device, comprising:
forming a first metal layer in contact with a source/drain region adjacent to a gate structure;

depositing an etch stop layer over the first metal layer and over the gate structure;

depositing an inter-layer dielectric (ILD) layer over the etch stop layer;

etching the etch stop layer and the ILD layer in a region over the first metal layer to form a first opening that exposes the first metal layer, wherein the first opening has a bottom portion including lateral protrusions and a top portion disposed over the bottom portion, and wherein the bottom portion is wider than the top portion;

depositing an oxide layer on sidewall surfaces of the first opening; and selectively depositing a second metal layer onto the exposed first metal layer within the first opening to form a contact via.

12. The method of claim 11, wherein the top portion includes a tapered profile.

13. The method of claim 11, further comprising:
etching the etch stop layer and the ILD layer in a region over the gate structure to form a second opening that exposes a metal gate layer of the gate structure;

depositing a glue layer on sidewalls of the second opening and on an exposed top surface of the metal gate layer; and depositing a third metal layer on the glue layer within the second opening.

14. The method of claim 13, wherein the glue layer substantially prevents formation of an oxide layer on the exposed top surface of the metal gate layer.

15. The method of claim 13, wherein the glue layer includes Ti, TiN, or a combination thereof.

16. The method of claim 13, further comprising:
after depositing the third metal layer, performing a chemical mechanical polishing process;

wherein the lateral protrusions of the bottom portion prevent CMP slurry introduced during the chemical mechanical polishing process from attacking the first metal layer.

17. A method, comprising:
prior to forming a gate via opening that exposes a gate structure, forming a contact via having an inverted T-shape, wherein the contact via provides an electrical connection to an underlying metal layer in contact with a substrate region adjacent to the gate structure, and wherein forming the contact via having the inverted T-shape comprises:
etching a dielectric layer and an etch stop layer in a region over the underlying metal layer to form a contact via opening that exposes the underlying metal layer, wherein a first portion of the contact via opening adjacent to the underlying metal layer includes cavities on opposing sides of the contact via opening, wherein a second portion of the contact via opening is disposed over the first portion, and wherein the first portion is wider than the second portion;

performing an oxide re-deposition process to form a passivation layer on surfaces of the contact via opening, wherein the underlying metal layer remains exposed; and selectively forming a first metal layer within the contact via opening, over the passivation layer, and in contact with the underlying metal layer to provide the contact via having the inverted T-shape.

18. The method of claim 17, further comprising:
after forming the contact via having the inverted T-shape, etching the dielectric layer and the etch stop layer in a region over the gate structure to form the gate via opening that exposes a metal gate layer of the gate structure; and depositing a second metal layer within the gate via opening to provide a gate via in contact with the exposed metal gate layer.

19. The method of claim 18, further comprising:
after depositing the second metal layer, performing a chemical mechanical polishing process until top surfaces of the dielectric layer and the first metal layer are exposed, wherein the inverted T-shape of the contact via prevents slurry introduced during the chemical mechanical polishing process from attacking the underlying metal layer.

20. The method of claim 17, wherein the passivation layer passivates at least one defect on sidewall surfaces of the contact via opening, and wherein the passivation layer blocks diffusion of impurities from the etch stop layer.

\* \* \* \* \*